(12) United States Patent
Lee

(10) Patent No.: US 11,899,165 B2
(45) Date of Patent: Feb. 13, 2024

(54) DISPLAY PANEL AND METHOD OF MANUFACTURING THE SAME

(71) Applicant: LG Display Co., Ltd., Seoul (KR)

(72) Inventor: Shin-Bok Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 610 days.

(21) Appl. No.: 16/942,162

(22) Filed: Jul. 29, 2020

(65) Prior Publication Data

US 2021/0165133 A1   Jun. 3, 2021

(30) Foreign Application Priority Data

Nov. 29, 2019   (KR) .................. 10-2019-0156745

(51) Int. Cl.
*G02B 1/14*   (2015.01)
*G06F 1/16*   (2006.01)
*G06F 1/18*   (2006.01)
*H10K 50/84*   (2023.01)

(52) U.S. Cl.
CPC ............. *G02B 1/14* (2015.01); *G06F 1/1652* (2013.01); *G06F 1/182* (2013.01); *H10K 50/84* (2023.02)

(58) Field of Classification Search
CPC ........ G02B 1/14; G06F 1/1652; H10K 50/84; H10K 71/00
See application file for complete search history.

(56) References Cited

U.S. PATENT DOCUMENTS

2017/0123461 A1*   5/2017   Kim ..................... H05K 5/0017

FOREIGN PATENT DOCUMENTS

| CN | 103872084 A | * | 6/2014 | ............... G09F 9/00 |
| KR | 20130134973 A | * | 12/2013 | |
| KR | 20160069575 A | * | 6/2016 | |

* cited by examiner

*Primary Examiner* — Sophie Hon
(74) *Attorney, Agent, or Firm* — Seed IP Law Group LLP

(57) ABSTRACT

Embodiments of the present disclosure relate to a display panel and a method of manufacturing the same. A high-reliability display panel with a reduced bezel area or substantially no bezel area and a method of manufacturing the same.

16 Claims, 16 Drawing Sheets

DISPLAY PANEL AND METHOD OF MANUFACTURING THE SAME

CROSS REFERENCE TO RELATED APPLICATION

This application claims priority from Korean Patent Application No. 10-2019-0156745, filed on Nov. 29, 2019, which is hereby incorporated by reference for all purposes as if fully set forth herein.

BACKGROUND

Technical Field

Embodiments of the present disclosure relate to a display panel and a method of manufacturing the same, and more particularly, to a high-reliability display panel with a reduced bezel area or substantially no bezel area, and a method of manufacturing the same.

Description of Related Art

Along with the development of the information society, demands for display devices that display images are growing. In this regard, various types of display devices, such as liquid crystal display (LCD) devices, plasma display device, and organic light emitting diode (OLED) display devices, have been widely used.

In recent years, not only display quality but also outward designs satisfying users' sense of aesthetics are required for display devices. In order to realize a design offering a fashionable look, the bezel area of a display device should be minimized or substantially removed. However, it is not easy to minimize or substantially remove the bezel area.

Moreover, since the display device contains a material vulnerable to oxidization by external moisture or oxygen, various techniques of sealing a display panel are used to block or minimize the introduction of moisture or oxygen from the outside.

BRIEF SUMMARY

The inventors of the present disclosure realized that existing encapsulation methods for preventing the introduction of moisture or oxygen into a display panel or a display device have limitations in that a complex process is required or it is difficult to achieve a thin bezel.

For example, an edge seal method in which a frit is disposed between a glass encapsulation substrate and a substrate with pixels formed thereon, around the periphery of a display panel with the pixels has the shortcomings of vulnerability to external shocks and unsuitability for encapsulation of a large-screen display panel.

In this context, the inventors of the present disclosure have invented a high-reliability display panel which may be formed in a simple process and has a minimal bezel area or substantially no bezel area, and a method of manufacturing the same.

It will be appreciated by persons skilled in the art that the objects that could be achieved with the present disclosure are not limited to what has been particularly described hereinabove and the above and other objects that the present disclosure could achieve will be more clearly understood from the following detailed description.

An embodiment of the present disclosure provides a high-reliability display panel with a reduced bezel area or substantially no bezel area, and a method of manufacturing the same.

According to one or more embodiments of the present disclosure, provided is a display panel including a substrate, a light emitting element, a protection layer, a self-healing layer including a first self-healing layer positioned and a second self-healing layer, and a sealing layer filling a space between the first self-healing layer and the second self-healing layer.

The first self-healing layer is positioned on the protection layer and contains a first precursor. The second self-healing layer is positioned on the substrate and contains a second precursor.

The sealing layer fills the space between the first self-healing layer and the second self-healing layer with materials resulting from reaction of the first precursor and the second precursor, on at least one side surface of the substrate.

According to another embodiment of the present disclosure, provided is a method of manufacturing a display panel, including forming a light emitting element on a mother substrate, forming a protection layer on the light emitting element formed on the mother substrate, forming a self-healing layer including a first self-healing layer containing a first precursor on the protection layer and a second self-healing layer containing a second precursor on the mother substrate, and cutting the mother substrate into display panels and forming a sealing layer filling a space between the first self-healing layer and the second self-healing layer, on at least one side surface of a substrate in each of the display panels.

According to another embodiment of the present disclosure, provided is a display device including the above-described display panel. The display device includes the display panel and a driving circuit driving the display panel.

According to embodiments of the present disclosure, a display panel may be formed in a simple process and has a minimum or substantially no bezel area, and a method of manufacturing the same may be provided.

It will be appreciated by persons skilled in the art that the effects that can be achieved with the present disclosure are not limited to what has been particularly described hereinabove and other advantages of the present disclosure will be more clearly understood from the following detailed description taken in conjunction with the accompanying drawings.

DESCRIPTION OF THE SEVERAL VIEWS OF THE DRAWINGS

The above and other objects, features, and advantages of the present disclosure will be more clearly understood from the following detailed description, taken in conjunction with the accompanying drawings, in which.

DETAILED DESCRIPTION

Figure 1:
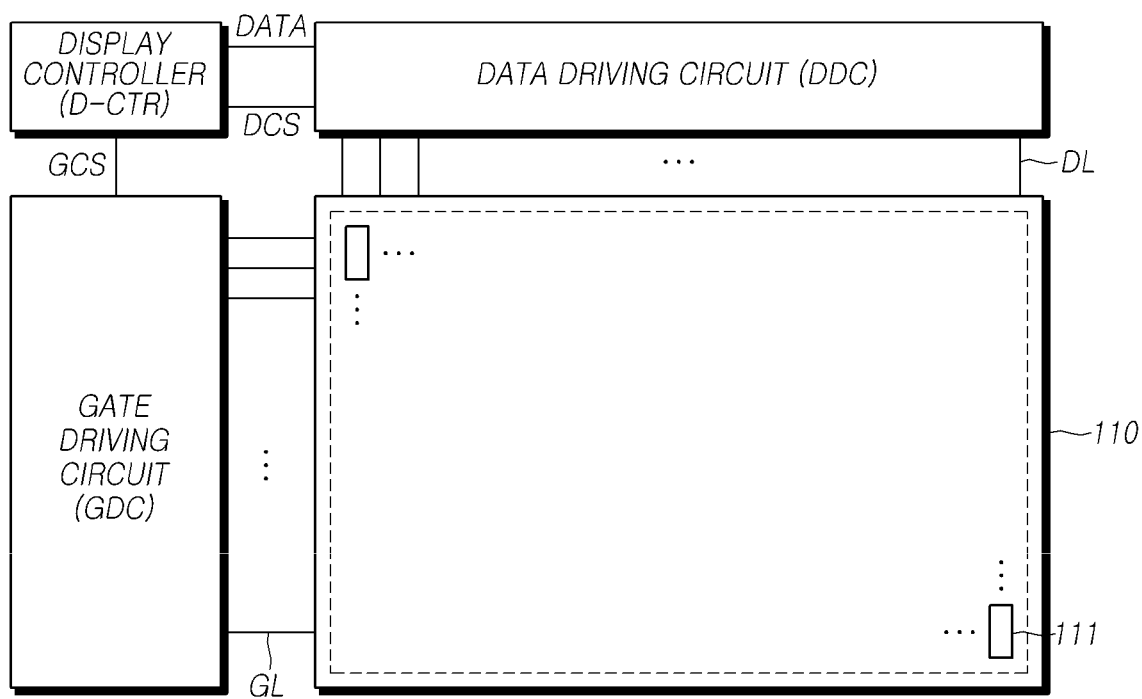
FIG. 1 is a schematic diagram illustrating the system configuration of a display device according to an embodiment of the present disclosure.

Advantages and features of the present disclosure and a method of achieving the advantages and features will be clear by referring to embodiments described below in detail together with the accompanying drawings. However, the present disclosure is not limited to the embodiments disclosed herein but will be implemented in various forms. The embodiments are provided by way of example only so that those skilled in the art can fully understand the present disclosure and the scope of the present disclosure.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "constituting" used herein are generally intended to allow other components to be added unless the terms are used with the term "only." Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly."

When an element or layer is disposed "on" another element or layer, another layer or another element may be interposed directly on the other element or therebetween.

Although the terms "first," "second," and the like are used for describing various components, these components are not confined by these terms. These terms are merely used for distinguishing one component from the other components. Therefore, a first component to be mentioned below may be a second component in the technical concept of the present disclosure.

The features of various embodiments of the present disclosure may be partially or entirely combined with each other and may be linked and operated in technically various ways, and the embodiments may be carried out independently of or in association with each other.

A description will be given of various configurations of a display panel and a display device, which have a thin bezel with excellent anti-humidity according to one or more embodiments of the present disclosure.

With reference to the attached drawings, various embodiments of the present disclosure will be described in detail.

FIG. 1 illustrates the system configuration of a display device 100 according to embodiments of the present disclosure.

Referring to FIG. 1, the display device 100 according to the embodiments of the present disclosure may include a display panel 110 in which a plurality of data lines DL and a plurality of gate lines GL are disposed, and a plurality of subpixels 111 formed adjacent to the plurality of data lines DL and the plurality of gate lines GL, a data driving circuit DDC driving the plurality of data lines DL, a gate driving circuit GDC driving the plurality of gate lines GL, and a controller D-CTR controlling the data driving circuit DDC and the gate driving circuit GDC.

The controller D-CTR may supply various control signals DCS and GCS to the data driving circuit DDC and the gate driving circuit GDC to control the data driving circuit DDC and the gate driving circuit GDC.

According to embodiments of the present disclosure, the display device 100 may be an organic light emitting diode (OLED) display device, a liquid crystal display (LCD) device, a plasma display device, or the like.

When the display device 100 according to embodiments of the present disclosure is an OLED device, each subpixel 111 arranged on the display panel 110 may include a light emitting element including circuit elements such as an OLED which is a self-emissive device and a driving transistor driving the OLED. The types and number of circuit elements in each light emitting element may vary with provided functions and design schemes.

Figure 2:
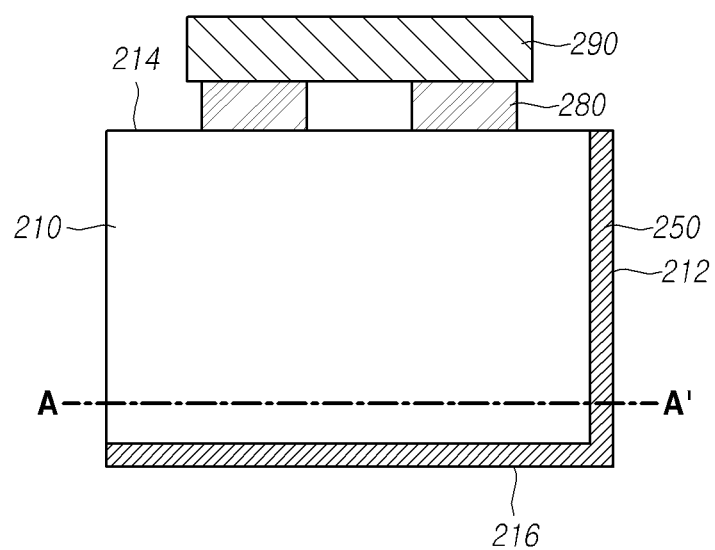
FIG. 2 is a plan view illustrating a display panel according to an embodiment of the present disclosure.
Figure 3:
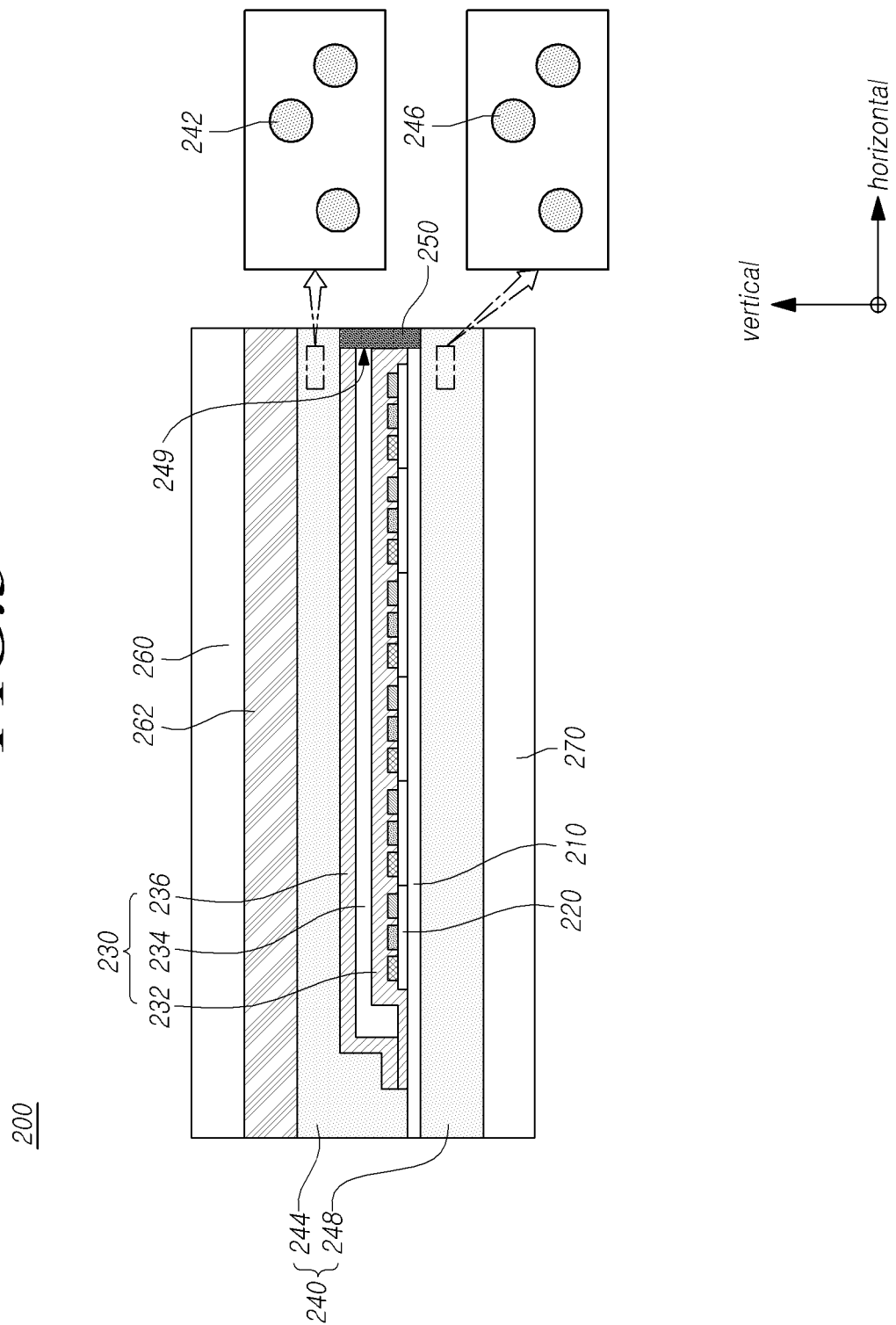
FIG. 3 is a sectional view illustrating the display panel illustrated in FIG. 2, taken along line A-A.

FIG. 2 is a plan view illustrating a display panel according to one or more embodiments of the present disclosure. FIG. 3 is a sectional view illustrating the display panel illustrated in FIG. 2, taken along line A-A'.

Referring to FIGS. 2 and 3, a display panel 200 according to one or more embodiments of the present disclosure may include a substrate 210, light emitting elements 220 positioned on the substrate 210, a protection layer 230 positioned on the light emitting elements 220 and encapsulating the light emitting elements 220, a self-healing layer 240 including a first self-healing layer 244 positioned on the protection layer 230 and including a first precursor 242, and a second self-healing layer 248 positioned on the substrate 210 and including a second precursor 246, and a sealing layer 250 in which materials resulting from reaction of the first precursor 242 and the second precursor 246 fills a space between the first self-healing layer 244 and the second self-healing layer 248 on at least one side surface 212 of the substrate 210.

To have a flexible property, the substrate 210 may be formed of, but not limited to, a polymer such as polyimide.

Each of the light emitting elements 220 may include circuit elements such as an OLED and a driving transistor driving the OLED. The OLED may include a first electrode, a light emitting layer positioned on the first electrode, and a second electrode positioned on the light emitting layer.

The protection layer 230 may function to prevent intrusion of external moisture or oxygen and protect the light emitting elements 220 from external shocks. The protection layer 230 may include a first inorganic layer 232, an organic layer 234, and a second inorganic layer 236. The first inorganic layer 232 may cover the light emitting elements 220, the organic layer 234 may cover the first inorganic layer 232 on the first inorganic layer 232, and the second inorganic layer 236 may fully cover the organic layer 234 and the first inorganic layer 232.

As illustrated in FIG. 2, a flexible printed circuit board (FPCB) 280 or a tape carrier package (TCP) may be disposed on another side surface 214 of the substrate 210. A printed circuit board (PCB) 290 including multiple electrical elements in hardware may be coupled to the display panel 200 through the FPCB 280.

The sealing layer 250 may be disposed on two side surfaces 212 and 216 (see FIG. 2 and FIG. 6 described later on) or on three side surfaces 212, 216 and 218 (see FIG. 8 described later on), except for the side surface 214 of the substrate 210 on which the FPCB 280 is disposed.

As illustrated in FIG. 3, the display panel 200 may include a barrier film 260 attached onto the first self-healing layer 244 by an adhesive layer 262, and a back plate 270 disposed on the second self-healing layer 248, which should not be construed as limiting the present disclosure.

The substrate 210, the light emitting elements 220, and the protection layer 230 may form the same vertical surfaces on the side surfaces 212 and 216 of the substrate 210 on which the sealing layer 250 is formed. In some embodiments, the substrate 210, the light emitting elements 220, and the protection layer 230 may have substantially coplanar side surfaces with each other at a location where the sealing layer 250 is formed. As described later with reference to FIGS. 12 to 15, in a process of manufacturing two or more display panels by cutting a mother substrate on which the light emitting elements 220 and the protection layer 230 are formed in the same process by laser, the resulting laser-cut surface may form a vertical surface. The vertical surface refers to a surface substantially perpendicular to a horizontal surface.

Figure 4:
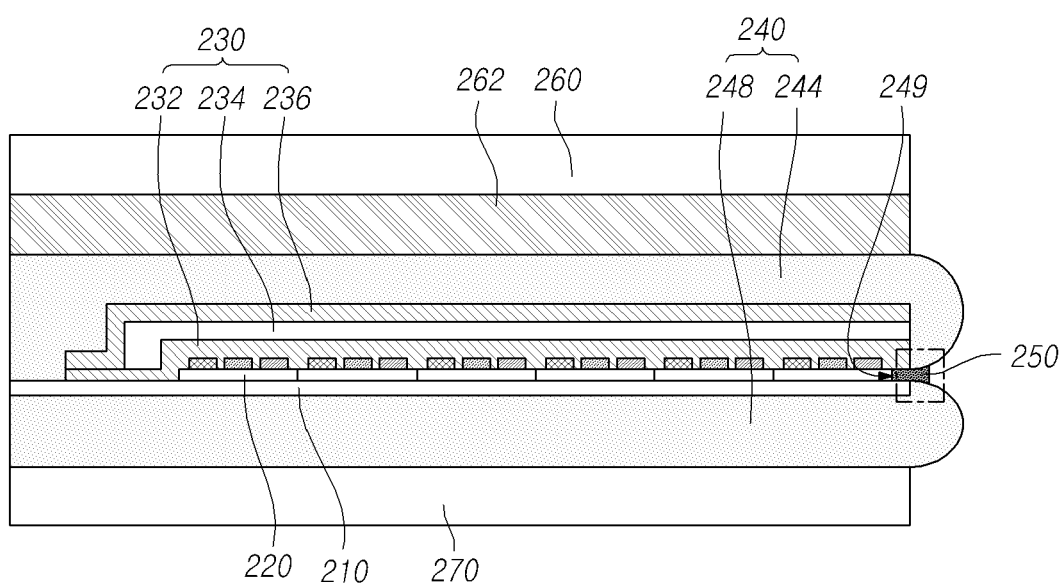
FIG. 4 is an enlarged view illustrating a sealing layer illustrated in FIG. 3.
Figure 4:
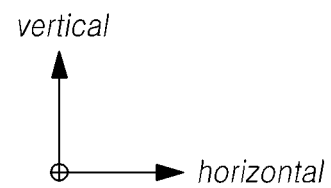
Figure 5:
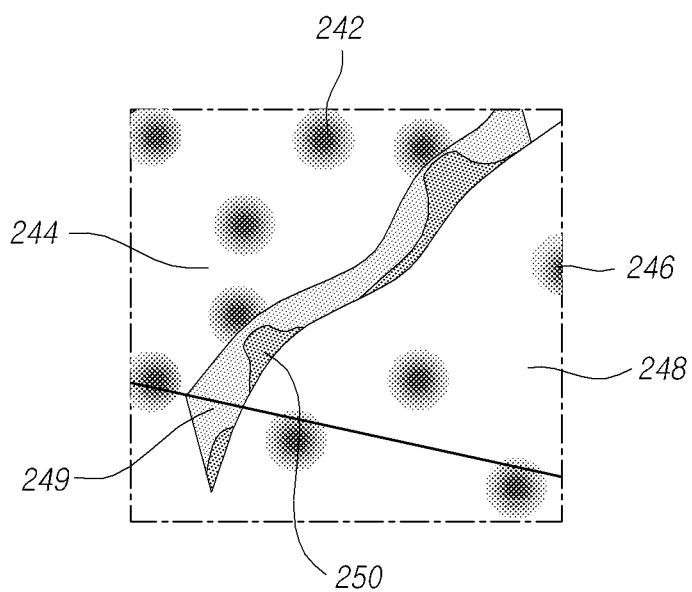
FIG. 5 illustrates the sealing layer illustrated in FIG. 3 in which materials to which first and second polymer precursors are polymerized fill a space between first and second self-healing layers.

FIG. 4 is an enlarged view illustrating the sealing layer illustrated in FIG. 3. FIG. 5 illustrates the sealing layer illustrated in FIG. 3, in which materials to which first and second polymer precursors are polymerized fill a space between the first and second self-healing layers.

Referring to FIG. 4, the first self-healing layer 244 and the second self-healing layer 248 may protrude outward from the vertical surface formed by the substrate 210, the light emitting elements 220, and the protection layer 250. For example, each of the first self-healing layer 244 and the second self-healing layer 248 may protrude outward from the vertical surface, in a circular or elliptical form as a whole.

The sealing layer 250 may partially fill the space between the first self-healing layer 244 and the second self-healing layer 248 on at least one surface of the substrate 210, and contact the vertical surface.

The first self-healing layer 244 and the second self-healing layer 248 may be formed of substantially the same or different materials. For example, the first self-healing layer 244 and the second self-healing layer 248 may independently include the first precursor 242 and the second precursor 246 distributed in acryl-based resin or epoxy-based resin matrices, respectively.

The first precursor 242 and the second precursor 246 may be the same or different materials.

The first precursor 242 may be a first polymer precursor, and the second precursor 246 may be a second polymer precursor.

The first self-healing layer 244 may further include one or more of capsules and fibers containing the first polymer precursor 242. The second self-healing layer 248 may further include one or more of capsules and fibers containing the second polymer precursor 246.

In the sealing layer 250, materials to which the first polymer precursor 242 and the second polymer precursor 246 are polymerized may fill a space 249 between the first self-healing layer 244 and the second self-healing layer 248. That is, the polymerized materials or polymers may fill the space 249 between the first self-healing layer 244 and the second self-healing layer 248 in the sealing layer 250.

Polymers may be classified into covalent bonded self-healing polymers and supramolecular network self-healing polymers according to their bonding or shapes for self-healing.

For example, capsules or fibers may be filled with the first and second polymer precursors 242 and 246.

As described before, as the display panel 200 according to one or more embodiments of the present disclosure includes the first self-healing layer 244 and the second self-healing layer 248, cracks on the display panel 200 may be healed in the same manner.

Figure 6:
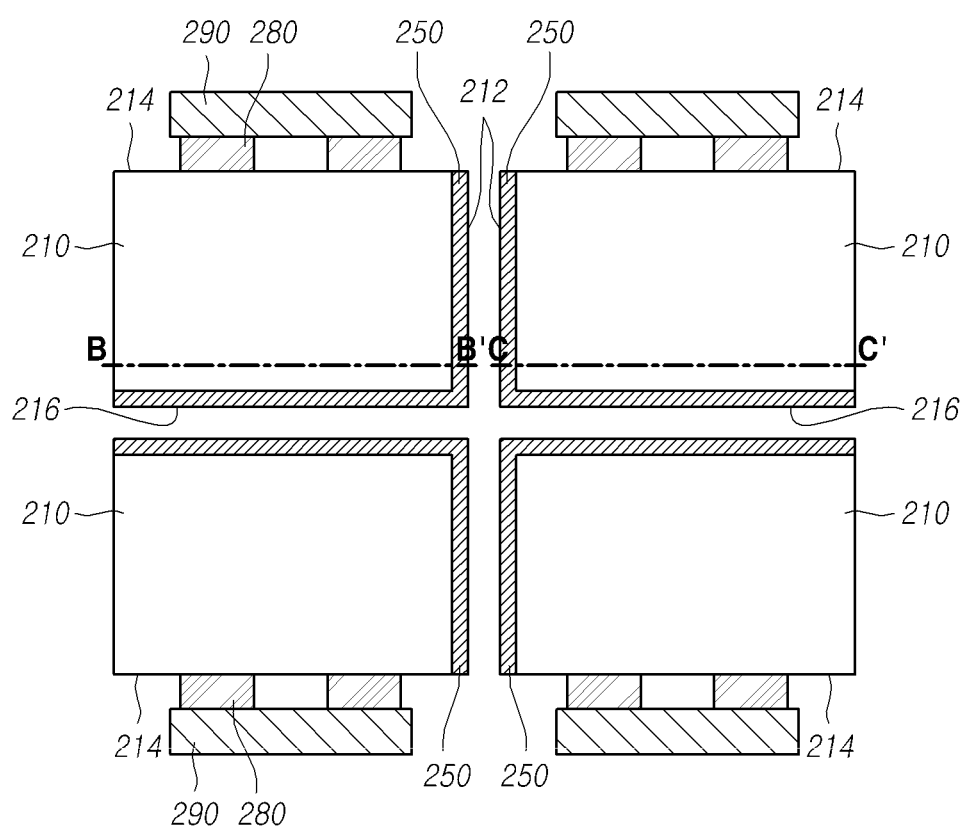
FIGS. 6, 7 and 8 are diagrams illustrating arrangements of sealing layers in display panels according to an embodiment of the present disclosure.
Figure 7:
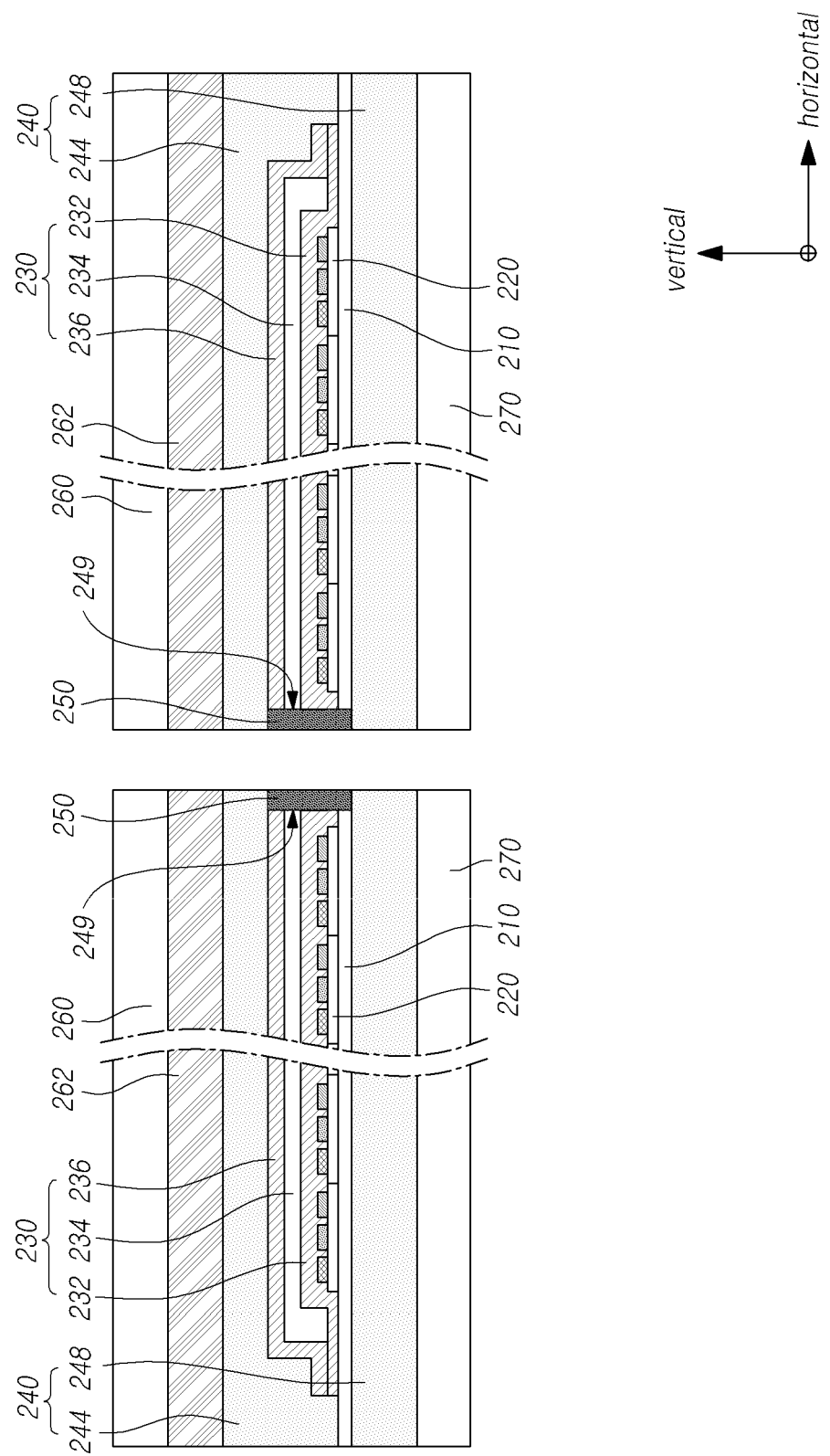
Figure 8:
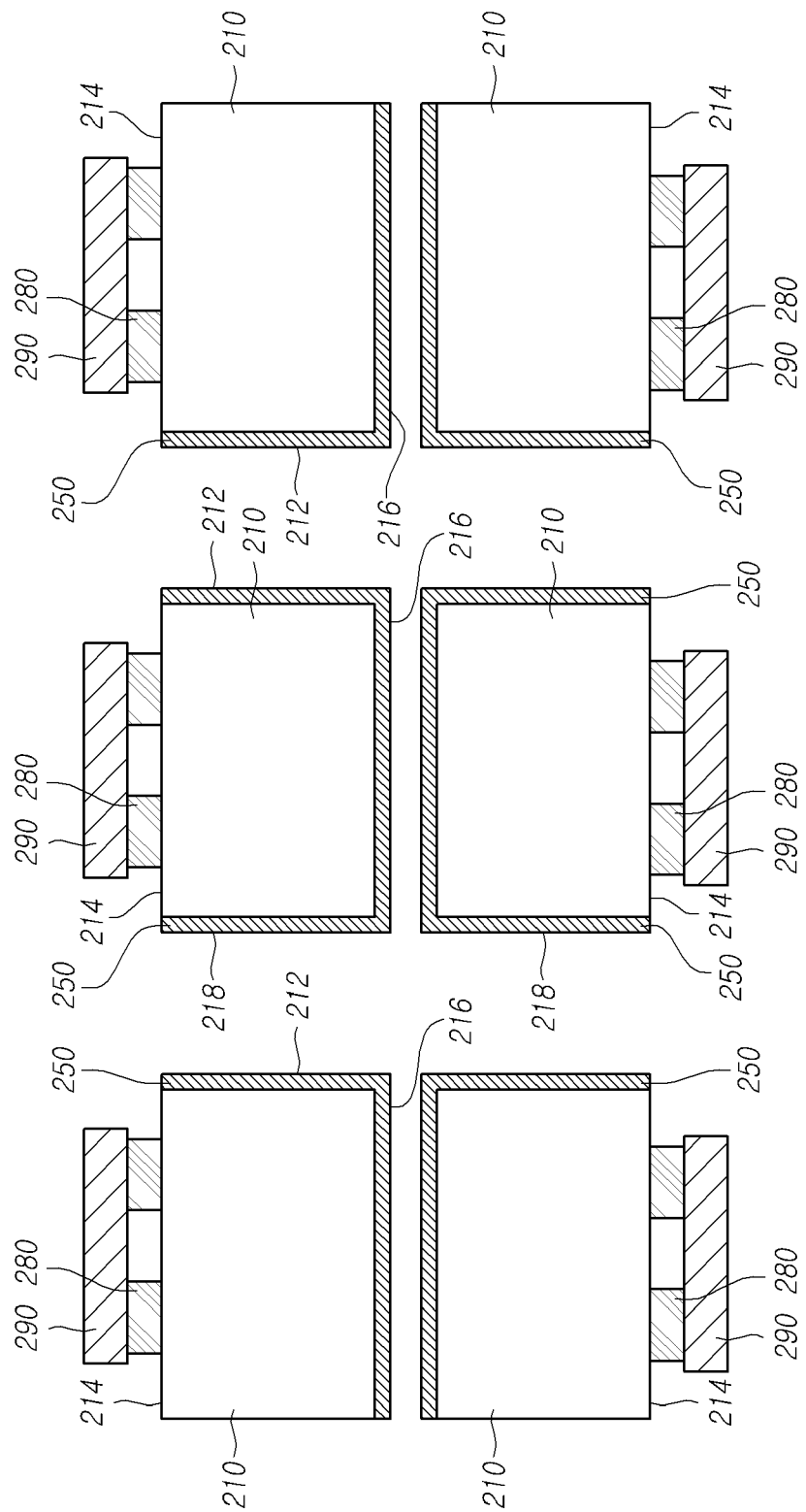

FIGS. 6, 7 and 8 are diagrams illustrating arrangements of sealing layers in display panels according to one or more embodiments of the present disclosure.

Referring to FIG. 6, in a process of manufacturing 2×2 display panels by cutting a mother substrate on which the light emitting elements 220 and the protection layer 230 are formed in the same process, the sealing layer 250 may be disposed on the two side surfaces 212 and 216 other than the side surface 214 of the substrate 210 on which the FPCB 280 is disposed, in each display panel. As illustrated in FIG. 7, two display panels may have the same shape, symmetrically arranged on both sides.

Referring to FIG. 8, in a process of manufacturing 3×2 display panels by cutting a mother substrate on which the light emitting elements 220 and the protection layer 230 are formed in the same process, the sealing layer 250 may be disposed on the two side surfaces 212 and 216 other than the side surface 214 of the substrate 210 on which the FPCB 280 is disposed, in each of four display panels on both sides. In contrast, the sealing layer 250 may be disposed on the three side surfaces 212, 216 and 218 other than the side surface 214 of the substrate 210 on which the FPCB 280 is disposed, in each of two display panels in the middle.

In a process of manufacturing m×n display panels (m and n are natural numbers equal to or larger than 2) by cutting a mother substrate on which the light emitting elements 220 and the protection layer 230 are formed in the same process, the sealing layer 250 may generally be disposed on the three side surfaces 212, 216 and 218 other than the side surface 214 of the substrate 210 on which the FPCB 280 is disposed, in each of display panels in the middle.

In a process of manufacturing m×1 or 1×n display panels (m and n are natural numbers equal to or larger than 2) by cutting a mother substrate on which the light emitting elements 220 and the protection layer 230 are formed in the same process, the sealing layer 250 may be disposed on only one side surface 212 or 218 other than the side surface 214 of the substrate 210 on which the FPCB 280 is disposed, in each of four display panels on both sides, whereas the sealing layer 250 may be disposed on the two side surfaces 212 and 218 other than the side surface 214 of the substrate 210 on which the FPCB 280 is disposed, in each of display panels in the middle.

In describing this embodiment, a description of the same components as in the foregoing embodiment or corresponding components of the foregoing embodiment will not be provided herein. In this context, drawings according to this embodiment will be described below.

Figure 9:
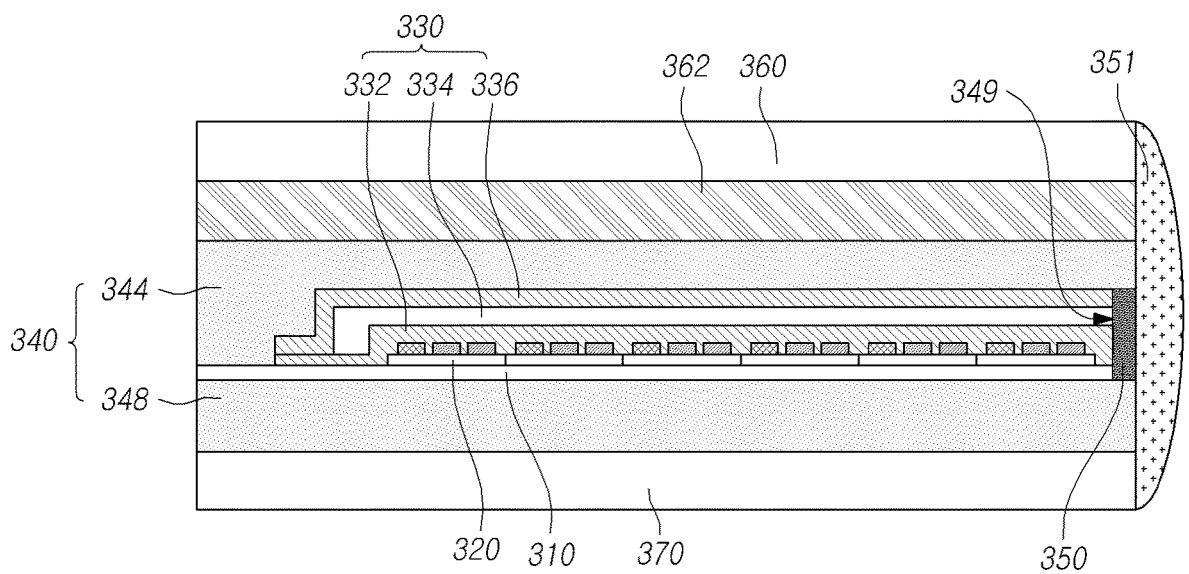
FIG. 9 is a sectional view illustrating a display panel according to another embodiment of the present disclosure.
Figure 9:
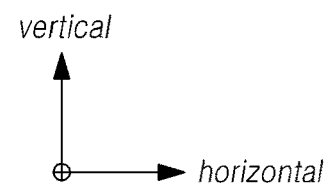

FIG. 9 is a sectional view illustrating a display panel according to another embodiment of the present disclosure.

Referring to FIG. 9, a display panel 300 according to another embodiment of the present disclosure may include a substrate 310, light emitting elements 320, a protection layer 330, a self-healing layer 340 including a first self-healing layer 344 and a second self-healing layer 348, and a sealing layer 350 filling a space 349 between the first self-healing layer 344 and the second self-healing layer 348.

For example, these components of the display panel 300 according to this embodiment may be identical to the substrate 210, the light emitting elements 220, the protection layer 230, the self-healing layer 240 including the first self-healing layer 244 and the second self-healing layer 248, and the sealing layer 250 filling the space between the first self-healing layer 244 and the second self-healing layer 248, which have been described before with reference to FIGS. 2 to 5.

The display panel 300 according to this embodiment may include a barrier film 360 attached onto the first self-healing layer 344 by an adhesive layer 362, and a back plate 370 disposed on the second self-healing layer 348, which should not be construed as limiting the present disclosure.

The display panel 300 according to this embodiment may further include a side encapsulation layer 351 encapsulating the light emitting elements 320, on a side surface with the sealing layer 350 disposed thereon. The side encapsulation layer 351 may function to block moisture or air or any other external, foreign materials from intruding into the side surface. Accordingly, the side encapsulation layer 351 may encapsulate the substrate 310, the light emitting elements 320, and the protection layer 330 in a manner that encapsulates the light emitting elements 320 in a sufficient range on the side surface with the sealing layer 350 disposed thereon.

For example, as illustrated in FIG. 9, the side encapsulation layer 351 may be positioned across the entire side surface of the barrier film 360, the adhesive layer 362, and the back plate 370 together with the substrate 310, the light emitting elements 320, and the protection layer 330, which should not be construed as limiting the present disclosure. Further, when other components are added on and under the substrate 310 and exposed from the side surface with the sealing layer 350 formed thereon, the side encapsulation layer 351 may have a structure that also encapsulates these components.

Figure 10:
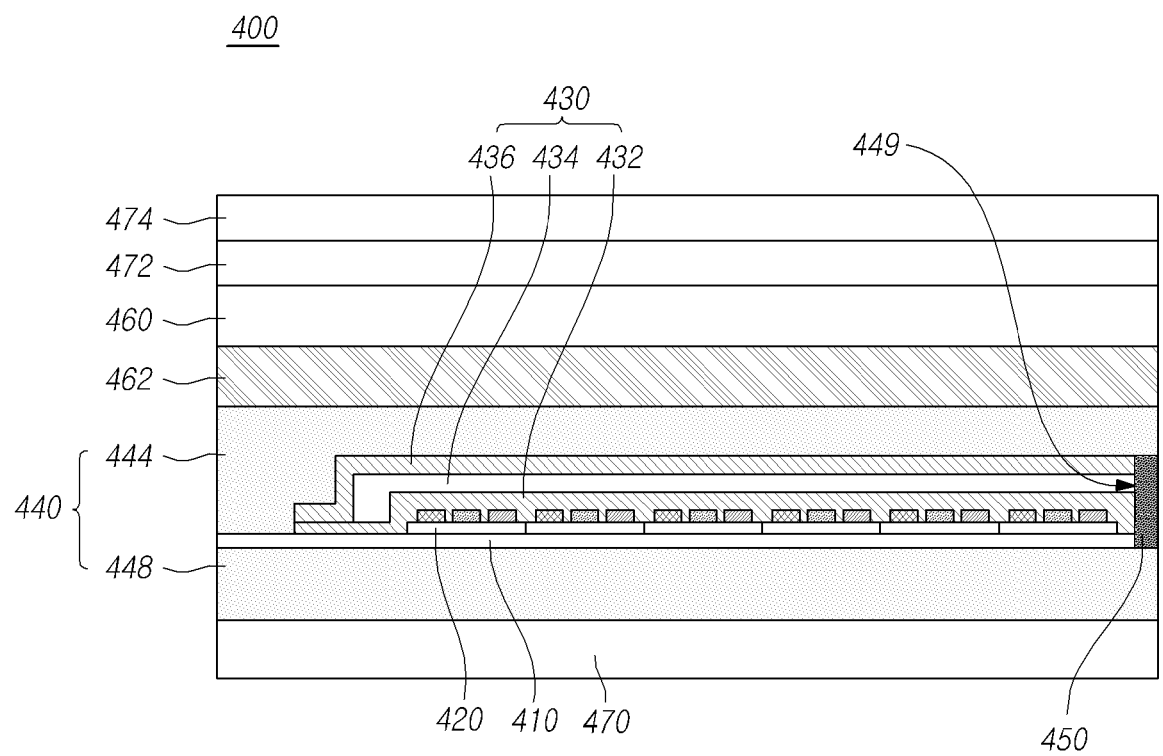
FIG. 10 is a sectional view illustrating a display panel according to another embodiment of the present disclosure.

FIG. 10 is a sectional view illustrating a display panel according to another embodiment of the present disclosure.

Referring to FIG. 10, a display panel 400 according to another embodiment of the present disclosure may include a substrate 410, light emitting elements 420, a protection layer 430, a self-healing layer 440 including a first self-healing layer 444 and a second self-healing layer 448, and a sealing layer 450 filling a space between the first self-healing layer 444 and the second self-healing layer 448.

For example, these components of the display panel 400 according to this embodiment may be identical to the substrate 210, the light emitting elements 220, the protection layer 230, the self-healing layer 240 including the first self-healing layer 244 and the second self-healing layer 248, and the sealing layer 250 filling the space between the first self-healing layer 244 and the second self-healing layer 248, which have been described before with reference to FIGS. 2 to 5.

The display panel 400 according to this embodiment may include a barrier film 460 attached onto the first self-healing layer 444 by an adhesive layer 462, and a back plate 470 disposed on the second self-healing layer 448, which should not be construed as limiting the present disclosure.

The display panel 400 according to this embodiment may further include a polarization plate 472 on the barrier film 460 to block external light, and a cover window 474 protecting the display panel 400, which should not be construed as limiting the present disclosure.

The display panels 100 to 400 according to the embodiments of the present disclosure, which have been described above with reference to FIGS. 2 to 10, may have the light emitting elements 120 to 420 close to side surfaces to minimize or substantially eliminate a bezel area. That is, these display panels 100 to 400 may enable implementation of bezel-less display devices.

Because the sealing layers 150 to 450 are disposed on side surfaces of the display panels 100 to 400, the sealing layers 150 to 450 may prevent moisture or air from intruding from the side surfaces. Therefore, the display panels 100 to 400 may achieve high reliability for products.

Figure 11:
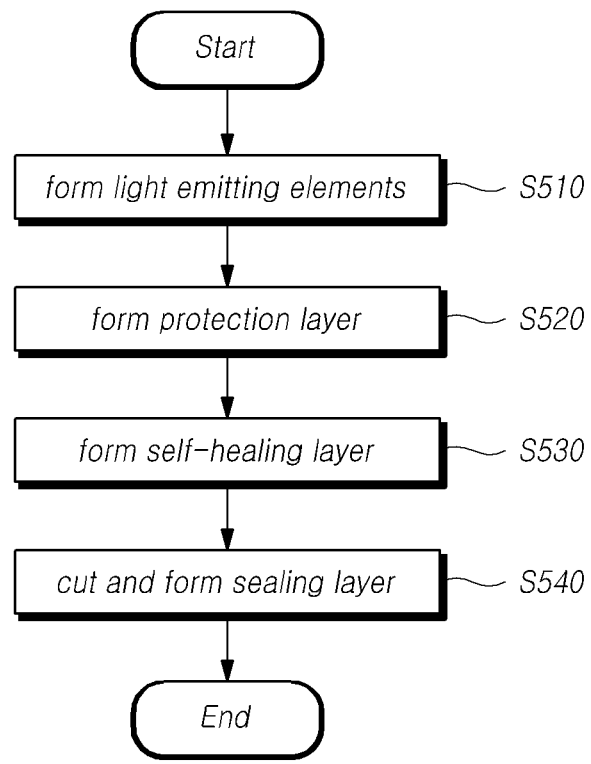
FIG. 11 is a flowchart illustrating a method of manufacturing a display panel according to another embodiment of the present disclosure.

FIG. 11 is a flowchart illustrating a method of manufacturing a display panel according to another embodiment of the present disclosure.

Referring to FIG. 11, a method 500 of manufacturing a display panel according to another embodiment of the present disclosure may include forming light emitting elements on a mother substrate (S510), forming a protection layer on the light emitting elements formed on the mother substrate (S520), forming a self-healing layer including a first self-healing layer containing a first precursor on the protection layer and a second self-healing layer containing a second precursor on the substrate (S530), cutting the mother substrate in units of display panel and forming, on at least one surface of the substrate in each display panel, a sealing layer in which materials resulting from reaction of the first precursor and the second precursor fill a space between the first self-healing layer and the second self-healing layer (S540).

Figure 16:
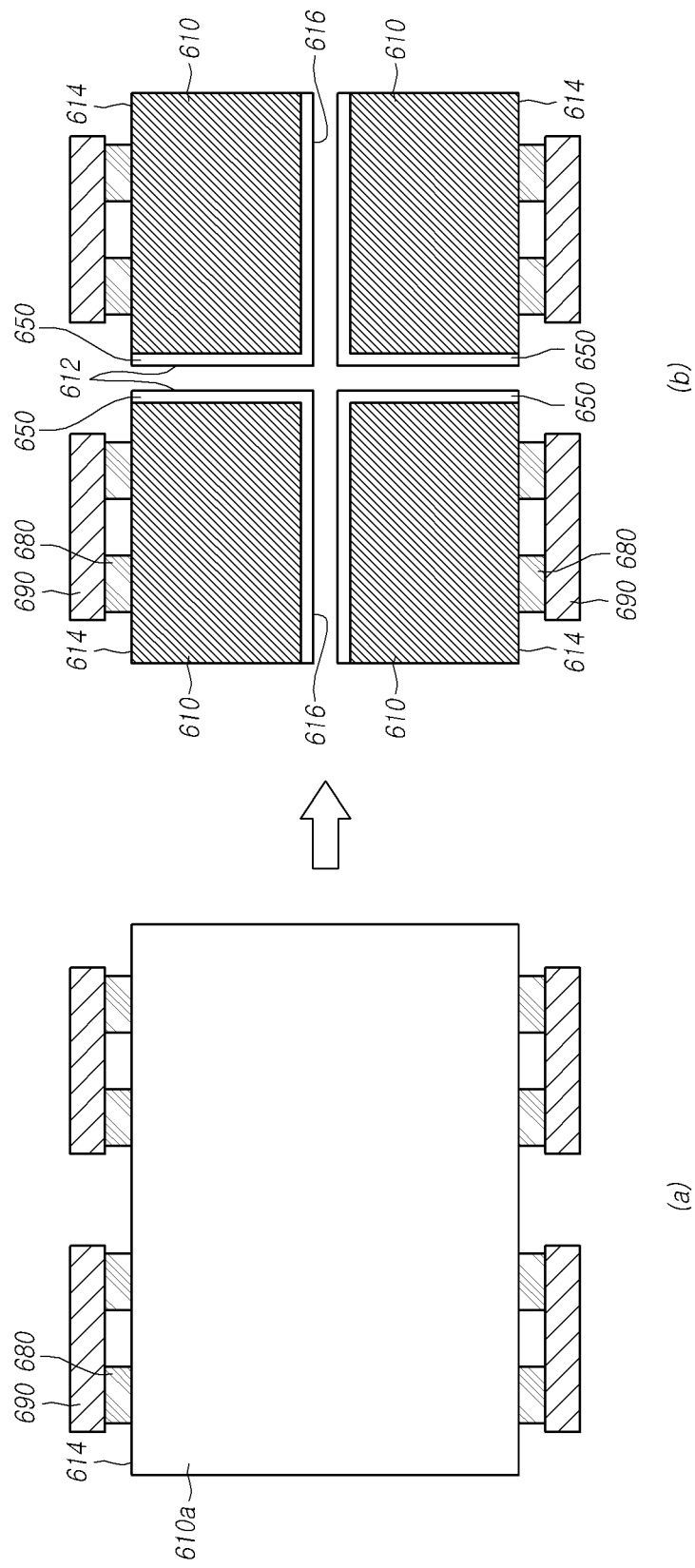
FIG. 16 is a plan view illustrating the display panel in each step of the method of manufacturing a display panel, illustrated in FIG. 11.

FIGS. 12 to 15 are sectional views illustrating the display panel in respective steps of the method of manufacturing a display panel, illustrated in FIG. 11. FIG. 16 is a plan view illustrating the display panel in each step of the method of manufacturing a display panel, illustrated in FIG. 11.

Figure 12:
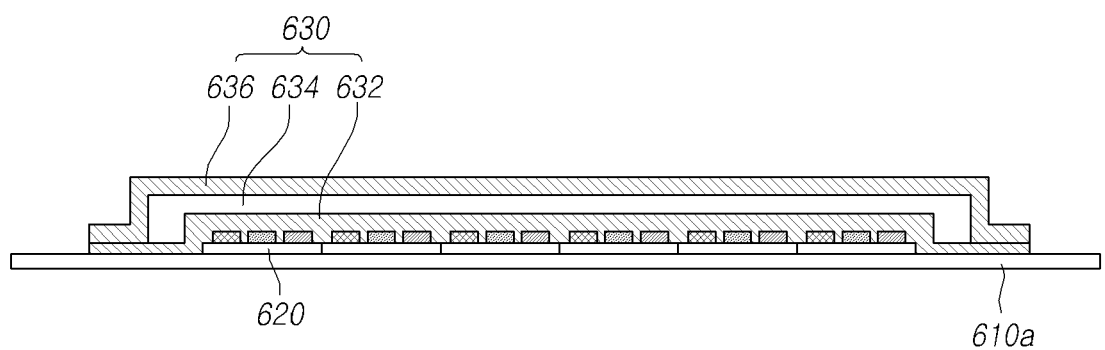
FIGS. 12 to 15 are sectional views illustrating the display panel in respective steps of the method of manufacturing a display panel, illustrated in FIG. 11.

Referring to FIGS. 11, 12 and 16(a), light emitting elements 620 each including a first electrode, a light emitting layer positioned on the first electrode, and a second electrode positioned on the light emitting layer are formed on a mother substrate 610a in step S510 for forming the light emitting elements 620.

In step S520 for forming a protection layer 630, the protection layer 630 is formed on the light emitting elements 620 formed on the mother substrate 610a, encapsulating the light emitting elements 620.

Figure 13:
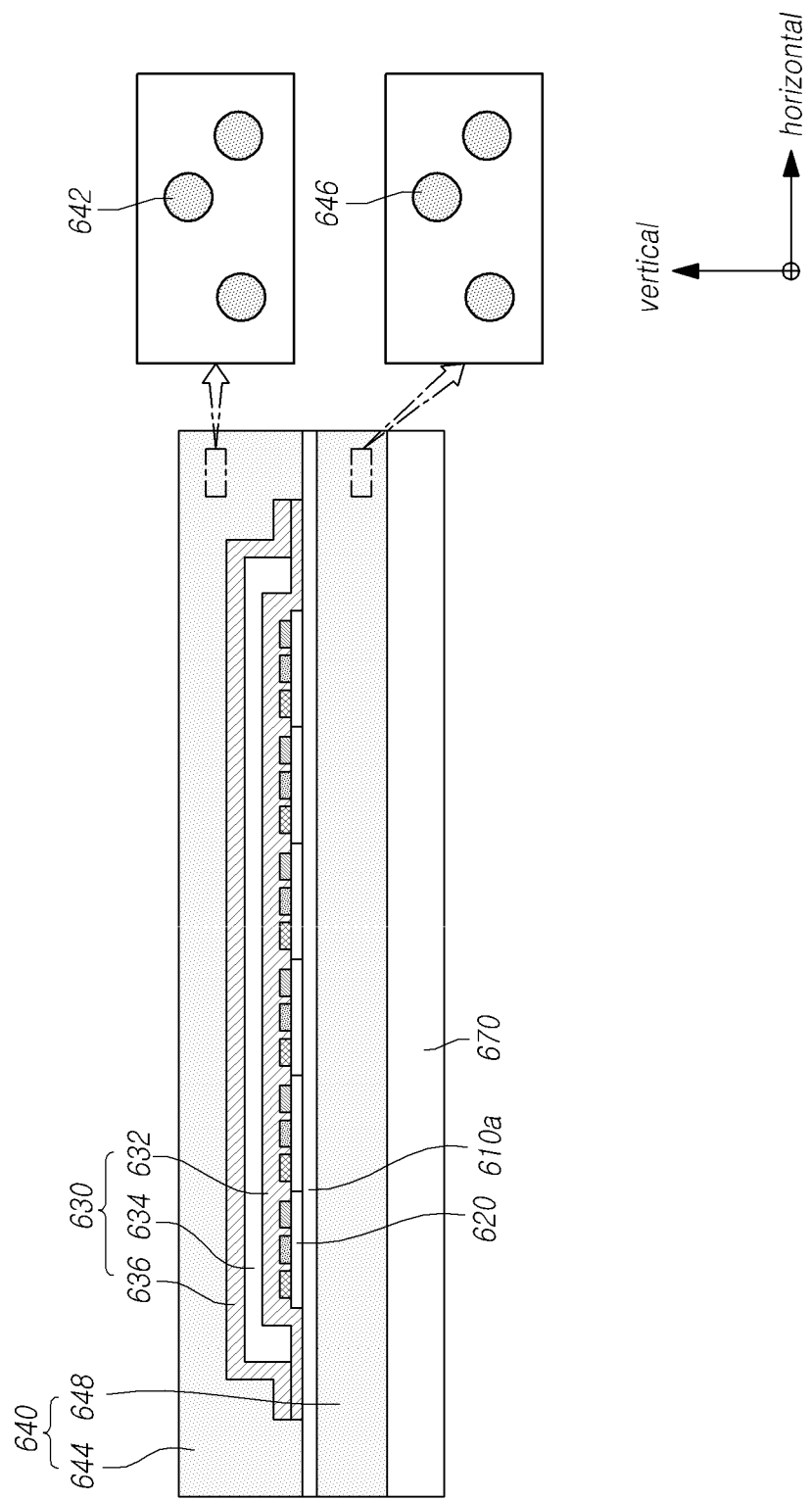
Figure 14:
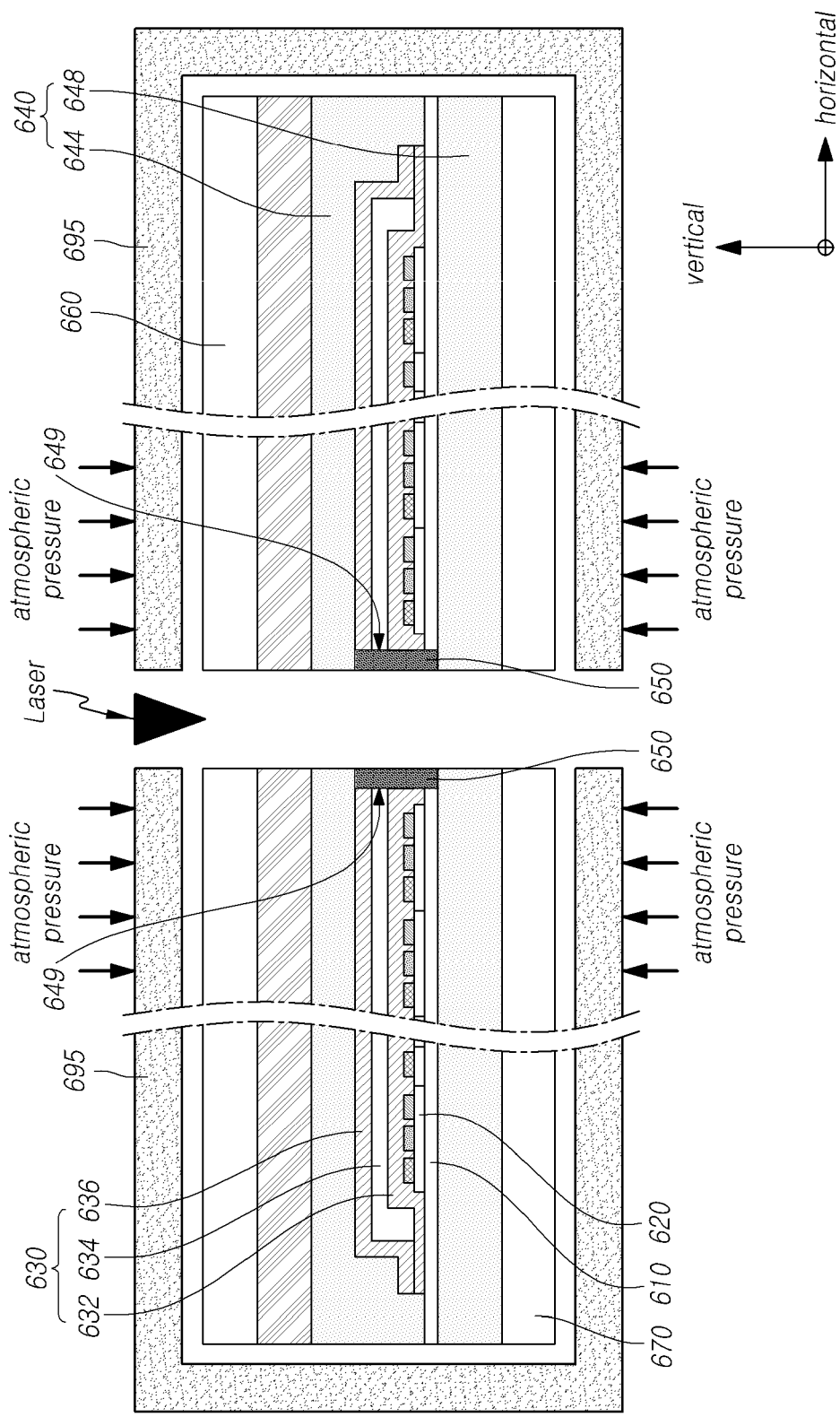
Figure 15:
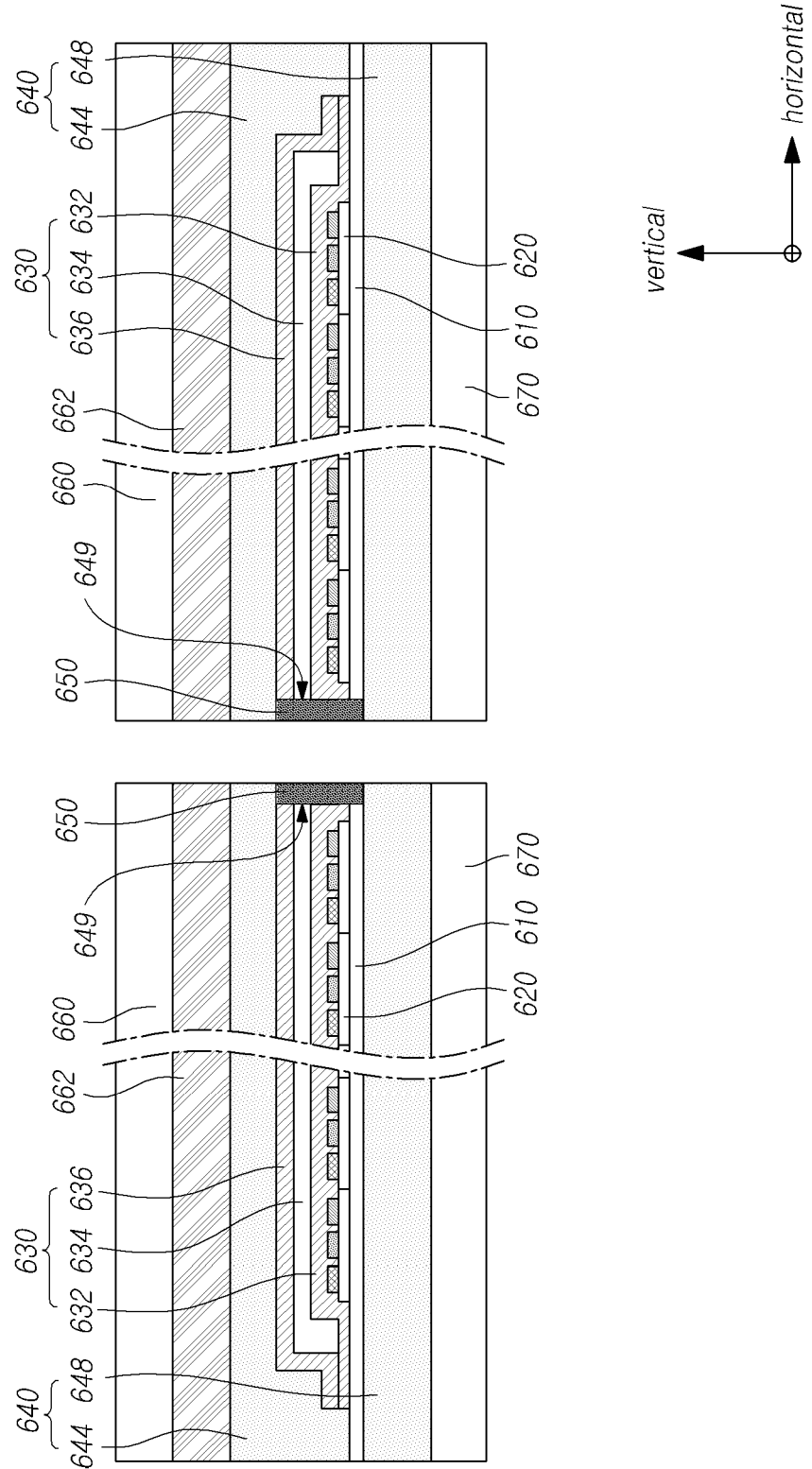

Referring to FIGS. 11, 13 and 16(a), a self-healing layer 640 including a first self-healing layer 644 containing a first precursor 642 on the protection layer 630 and a second self-healing layer 648 containing a second precursor 646 on the mother substrate 610a is formed in step S530 for forming the self-healing layer 640.

A first operation of forming the first self-healing layer 644 on the protection layer 630 and a second operation of forming the second self-healing layer 648 on the mother substrate 610a may be so independent that the first operation may be performed after the second operation, the second operation may be performed after the first operation, or both operations may be performed at the same time.

The first precursor 642 and the second precursor 646 may be the same material.

The first precursor 642 may be a first polymer precursor, and the second precursor 646 may be a second polymer precursor. The first self-healing layer 644 may further include one or more of capsules and fibers containing the first polymer precursor 642. The second self-healing layer 648 may further include one or more of capsules and fibers containing the second polymer precursor 646.

Polymers may be classified into covalent bonded self-healing polymers and supramolecular network self-healing polymers according to their bonding or shapes for self-healing.

Referring to FIGS. 11, 14, 15, and 16(*b*), in step S540 for forming a sealing layer 650, the mother substrate 610*a* may be cut into display panels 600, and the sealing layer 650 may be formed on at least one surface of a substrate in each display panel 600, in which materials resulting from reaction of the first precursor 642 and the second precursor 646 fill a space 649 between the first self-healing layer 644 and the second self-healing layer 648.

When the first precursor 642 is a first polymer precursor and the second precursor 646 is a second polymer precursor, the sealing layer 650 may fill the space between the first self-healing layer 644 and the second self-healing layer 648 with materials to which the first polymer precursor 642 and the second polymer precursor 646 are polymerized.

For example, capsules or fibers are filled with the first and second polymer precursors 642 and 646. In the process of manufacturing two or more display panels by cutting the mother substrate 610*a* on which the light emitting elements 620 and the protection layer 630 are formed in the same process, the capsules and/or the fibers included in the sealing layer 650 may be broken, the first and second polymer precursors 642 and 646 may flow out, and polymers to which the first and second polymer precursors 642 and 646 are polymerized may fill the space 649, thereby forming the sealing layer 650, which should not be construed as limiting the present disclosure.

In step S540 for forming the sealing layer 650, when the mother substrate 610*a* is cut in units of a display panel, the mother substrate 610*a* may be cut along two side surfaces 612 and 616 (see FIG. 16) or three side surfaces 612, 616, and 618 (see FIG. 8) other than a side surface 614 on which an FPCB 680 is disposed, and the sealing layer may be disposed on one side surface 612 or 618, two side surfaces 612 and 616, or three side surfaces 612, 616 and 618, other than the side surface 614 of a substrate 610, on which the FPCB 680 is disposed, in each display panel.

As described before, in a process of manufacturing m×n display panels (m and n are natural numbers equal to or larger than 2) by cutting the mother substrate 610*a* on which the light emitting elements 620 and the protection layer 630 are formed in the same process, the sealing layer 650 may be disposed on the three side surfaces 612, 616 and 618 other than the side surface 614 of the substrate 610 on which the FPCB 680 is disposed in each of display panels in the middle.

In a process of manufacturing m×1 or 1×n display panels (m and n are natural numbers equal to or larger than 2) by cutting the mother substrate 610*a* on which the light emitting elements 620 and the protection layer 630 are formed in the same process, the sealing layer 650 may be disposed on only the one side surface 612 or 618 other than the side surface 614 of the substrate 610 on which the FPCB 680 is disposed in each of display panels on both sides, whereas the sealing layer 650 may be disposed on the two side surfaces 612 and 618 other than the side surface 614 of the substrate 610 on which the FPCB 680 is disposed in each of display panels in the middle.

In step S540 for forming the sealing layer 650, when the mother substrate 610*a* is cut in units of a display panel, the mother substrate 610*a* may be cut into display panels in such a manner that the substrate 610 and the protection layer 630 of each display panel 600 form the same vertical surface on the side surface of the substrate 610, on which the sealing layer 650 is disposed.

In step S540 for forming the sealing layer 650, when the mother substrate 610*a* is cut in units of a display panel, the mother substrate 610*a* may be cut into display panels by pressing the mother substrate 610*a* with a fixing jig 695, and the first self-healing layer 644 and the second self-healing layer 648 may protrude outward from the vertical surface formed by the substrate 610 and the protection layer 630 or from a laser cutting surface, due to the pressing of the fixing jig 695.

The sealing layer 650 may partially fill the space 649 between the first self-healing layer 644 and the second self-healing layer 648 on at least one side surface of the substrate 610, and contact the vertical surface or the laser cutting surface.

As described before with reference to FIG. 4, each of the first self-healing layer 644 and the second self-healing layer 648 may protrude outward from the vertical surface or the laser cutting surface, in a circular or elliptical shape as a whole.

As described before with reference to FIG. 9, a step of forming the side encapsulation layer 351 encapsulating the light emitting elements 620 on the side surface with the sealing layer 650 disposed thereon may be further included. The step of forming the side encapsulation layer 351 may be performed after the step of forming the sealing layer 650.

When the display panel further includes the barrier film 360, the adhesive layer 262, and the back plate 370 in addition to the substrate 310, the light emitting elements 320, and the protection layer 330 as illustrated in FIG. 9 and further includes the polarization plate 472 blocking external light on the barrier film 470 and the cover window 474 protecting the display panel 400, the side encapsulation layer 351 may be formed across the entire side surface of these components.

The display panels 100 to 400 described before with reference to FIGS. 2 to 10 may be manufactured by partially modifying, adding a step to, or omitting a step from the afore-described method 500 of manufacturing a display panel.

From the perspective of a product, the method 500 of manufacturing a display panel according to the embodiments of the present disclosure described with reference to FIGS. 11 to 15 may minimize a bezel area or substantially eliminate the bezel area by disposing the light emitting elements 620 close to a side surface. That is, the display panels 100 to 400 may enable implementation of bezel-less display devices.

In the method 500 of manufacturing a display panel, the sealing layer 650 may be disposed on a side surface to prevent moisture or air from intruding into the display panels 100 to 400 from the side surface. Therefore, the display panels 100 to 400 may achieve high reliability for products.

From the perspective of a manufacturing method, the sealing layer 650 may be formed at the same time by the materials and structures of the first and second precursors 642 and 646, that is, the first and second polymer precursors contained in the first and second self-healing layers 644 and 648 during cutting, thereby sealing side surfaces of display panels. That is, the cutting process and the side surface sealing process may be performed simultaneously without an addition process by forming the first and second self-healing layers 644 and 648 before cutting the substrate.

Because the cutting process and the side surface sealing process are performed simultaneously without an additional process, exposure to moisture or air may be prevented during the sealing process.

Other embodiments of the present disclosure may provide a display device. The display device may include a display panel and a driving circuit driving the display panel. Since the display device according to the present embodiments adopts a display panel identical to the display panels 100 to 400 according to the embodiments of the present disclosure described above, a description of the display panel will be omitted herein.

In addition, the driving circuit included in the display device according to the embodiments of the present disclosure has been described above, and thus will not be described herein.

Those skilled in the art will appreciate that the present disclosure may be carried out in other specific ways than those set forth herein without departing from the spirit and essential characteristics of the present disclosure. The above embodiments are therefore to be construed in all aspects as illustrative and not restrictive. The scope of the protected features should be determined by the appended claims and their legal equivalents, not by the above description, and all changes coming within the meaning and equivalency range of the appended claims are intended to be embraced therein.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A display panel, comprising:
   a substrate;
   a light emitting element including a first electrode on the substrate, a light emitting layer on the first electrode, and a second electrode on the light emitting layer;
   a protection layer on the light emitting element;
   a self-healing layer including a first self-healing layer on the protection layer and containing a first polymer precursor, and a second self-healing layer on the substrate and containing a second polymer precursor; and
   a sealing layer positioned between the first self-healing layer and the second self-healing layer, on at least one of vertical surfaces formed by the substrate, and on at least one of vertical surfaces formed by the protection layer that is on the same side as the at least one of vertical surfaces formed by the substrate;
   wherein materials of the sealing layer are formed resulting from a reaction of the first polymer precursor from the first self-healing layer and the second polymer precursor from the second self-healing layer, and at least partially fill a space between the first self-healing layer and the second self-healing layer, and
   wherein the first polymer precursor is different from the second polymer precursor.

2. The display panel according to claim 1, wherein the sealing layer is disposed on one, two, or three of the vertical surfaces of the substrate, except for one of the vertical surfaces of the substrate on which a flexible printed circuit board (FPCB) is disposed.

3. The display panel according to claim 2, wherein the substrate and the protection layer form the same vertical surfaces on which the sealing layer is disposed.

4. The display panel according to claim 1, wherein the first self-healing layer and the second self-healing layer protrude outward from the vertical surface formed by the substrate and the protection layer, and wherein the sealing layer partially fills the space between the first self-healing layer and the second self-healing layer on the at least one of vertical surfaces of the substrate, and contacts the vertical surface.

5. The display panel according to claim 4, wherein each of the first self-healing layer and the second self-healing layer protrudes from the vertical surface, in a circular or elliptical shape as a whole.

6. The display panel according to claim 1,
   wherein the first self-healing layer further includes one or more of a capsule and a fiber each containing the first polymer precursor,
   wherein the second self-healing layer further includes one or more of a capsule and a fiber each containing the second polymer precursor, and
   wherein in the sealing layer, the first polymer precursor and the second polymer precursor are polymerized to form the materials that at least partially fill the space between the first self-healing layer and the second self-healing layer.

7. The display panel according to claim 1, further comprising a side encapsulation layer encapsulating the light emitting element on the vertical surface on which the sealing layer is disposed.

8. The display panel according to claim 1, wherein the materials of the sealing layer partially fills the space between the first self-healing layer and the second self-healing layer.

9. The display panel according to claim 1, wherein the materials of the sealing layer fully fills the space between the first self-healing layer and the second self-healing layer.

10. A method of manufacturing a display panel, the method comprising:
    forming, on a mother substrate, a light emitting element including a first electrode, a light emitting layer on the first electrode, and a second electrode on the light emitting layer;
    forming a protection layer on the light emitting element formed on the mother substrate to encapsulate the light emitting element;
    forming a first self-healing layer containing a first polymer precursor on the protection layer;
    forming a second self-healing layer containing a second polymer precursor on the mother substrate;
    cutting the mother substrate into a plurality of substrates, each substrate being a component of a display panel; and
    forming a sealing layer filling a space between the first self-healing layer and the second self-healing layer with materials resulting from reaction of the first polymer precursor from the first self-healing layer and the second polymer precursor from the second self-healing layer, on at least one vertical surface of a substrate of each of the plurality of substrates, and on at least one vertical surface of the protection layer that is on the same side as the at least one vertical surface of a substrate of each of the plurality of substrates, wherein the first polymer precursor is different from the second polymer precursor.

11. The method according to claim 10, wherein when the mother substrate is cut into a plurality of substrates, the mother substrate is cut along one, two, or three vertical surfaces except for one of the vertical surfaces of the substrate, on which a flexible printed circuit board (FPCB) is disposed, and the sealing layer is disposed on the one, two, or three vertical surfaces of the substrate, in each display panel.

12. The method according to claim 10, wherein when the mother substrate is cut into a plurality of substrates, the mother substrate is cut a plurality of display panels to enable the substrate and the protection layer to form the same vertical surface on the side surface of the substrate on which the sealing layer is disposed, in each of the display panels.

13. The method according to claim 10, wherein when the mother substrate is cut into a plurality of substrates, the mother substrate is cut into a plurality of display panels by pressing the mother substrate with a fixing jig, and the first self-healing layer and the second self-healing layer protrude outward from a vertical surface formed by the substrate and the protection layer due to the pressing of the fixing jig, and wherein the sealing layer partially fills the space between the first self-healing layer and the second self-healing layer, on at least one vertical surface of the substrate, and contacts the vertical surface.

14. The method according to claim 13, wherein each of the first self-healing layer and the second self-healing layer protrudes from the vertical surface, in a circular or elliptical shape as a whole.

15. The method according to claim 10,
wherein the first self-healing layer further includes one or more of a capsule and a fiber each containing the first polymer precursor,
wherein the second self-healing layer further includes one or more of a capsule and a fiber each containing the second polymer precursor, and
wherein in the sealing layer, the first polymer precursor and the second polymer precursor are polymerized to form the materials filling the space between the first self-healing layer and the second self-healing layer.

16. The method according to claim 10, further comprising:
forming a side encapsulation layer encapsulating the light emitting element on the vertical surface on which the sealing layer is disposed.

* * * * *

UNITED STATES PATENT AND TRADEMARK OFFICE
CERTIFICATE OF CORRECTION

| | | |
|---|---|---|
| PATENT NO. | : 11,899,165 B2 | Page 1 of 1 |
| APPLICATION NO. | : 16/942162 | |
| DATED | : February 13, 2024 | |
| INVENTOR(S) | : Shin-Bok Lee | |

It is certified that error appears in the above-identified patent and that said Letters Patent is hereby corrected as shown below:

In the Claims

Column 12, Claim 8, Line 41:
"self-healing laver."
Should be:
--shelf-healing layer.--.

Column 12, Claim 10, Line 61:
"sealing layer filling a space"
Should be:
--sealing layer by filling a space--.

Column 13, Claim 12, Line 16:
"substrate is cut a plurality"
Should be:
--substrate is cut into a plurality--.

Signed and Sealed this
Ninth Day of July, 2024

Katherine Kelly Vidal
*Director of the United States Patent and Trademark Office*